United States Patent
Krömer

(10) Patent No.: US 8,558,175 B2
(45) Date of Patent: Oct. 15, 2013

(54) SENSOR HEAD FOR AN X-RAY DETECTOR AND X-RAY DETECTOR CONTAINING SAID SENSOR HEAD

(75) Inventor: Robert Krömer, Berlin (DE)

(73) Assignee: Bruker Nano GmbH, Berlin (DE)

( * ) Notice: Subject to any disclaimer, the term of this patent is extended or adjusted under 35 U.S.C. 154(b) by 315 days.

(21) Appl. No.: 12/997,472

(22) PCT Filed: Jun. 3, 2009

(86) PCT No.: PCT/EP2009/056779
§ 371 (c)(1),
(2), (4) Date: Mar. 2, 2011

(87) PCT Pub. No.: WO2009/150080
PCT Pub. Date: Dec. 17, 2009

(65) Prior Publication Data
US 2011/0139987 A1 Jun. 16, 2011

(30) Foreign Application Priority Data
Jun. 13, 2008 (DE) .......................... 10 2008 028 487

(51) Int. Cl.
*G01J 1/00* (2006.01)
(52) U.S. Cl.
USPC ....................................................... 250/336.1
(58) Field of Classification Search
USPC ....................................................... 250/336.1
See application file for complete search history.

(56) References Cited

U.S. PATENT DOCUMENTS

| 4,810,881 A | 3/1989 | Berger et al. |
| 6,153,883 A * | 11/2000 | Arai .................... 250/370.15 |
| 2007/0134906 A1 * | 6/2007 | Nygard .................... 438/618 |

FOREIGN PATENT DOCUMENTS

| JP | 58039037 A | * | 3/1983 |
| JP | 04 061173 | | 2/1992 |
| JP | 10 012851 | | 1/1998 |

OTHER PUBLICATIONS

International Search Report dated Oct. 28, 2009.

* cited by examiner

*Primary Examiner* — David Porta
*Assistant Examiner* — Hugh H Maupin
(74) *Attorney, Agent, or Firm* — VLP Law Group LLP

(57) ABSTRACT

The invention relates to a reduced sensor head (30) for an X-ray detector (74), comprising a printed circuit board (10) having an end face (12) and lateral faces (14), a sensor chip (32) which is arranged on the end face (12) of the printed circuit board (10) and which is sensitive to X-ray radiation (72), a plurality of signal and control connections (40), a plurality of bonding islands (16) which are arranged on the printed circuit board (10) so as to make contact and which are electrically conductively connected to the signal and control connections (40) by means of at least one respective bonding wire (46), wherein the bonding islands (16) are arranged on the lateral faces (14) of the printed circuit board (10). The inventive arrangement of the bonding islands (16) on the lateral faces (14) of the printed circuit board (10), together with lateral bonding of the bonding wires (46), allows the components of the sensor head (30) to be arranged in a space-saving manner, the overall result of which is a reduction in the sensor head (30).

15 Claims, 11 Drawing Sheets

SENSOR HEAD FOR AN X-RAY DETECTOR AND X-RAY DETECTOR CONTAINING SAID SENSOR HEAD

PRIORITY CLAIM

This is a U.S. national stage of application No, PCT/EP2009/056779, filed on Jun. 3, 2009. Priority is claimed on the following application: DE Application No. 102008028487.4 Filed on Jun. 13, 2008, the content of which is incorporated herein by reference.

BACKGROUND OF THE INVENTION

The invention relates to a sensor head for an X-ray detector and to an X-ray detector containing said sensor head, particularly for electron beam microanalysis.

Electron beam microanalysis is a widely used method of elementary analysis. This involves the detection and evaluation of X-ray radiation which is produced in an electron microscope, particularly a scanning electron microscope (SEM), when a sample is scanned by an electron beam. Having initially being planned only as a special application in conjunction with appliances designed specifically for the purpose, such as electron beam microprobes, electron beam microanalysis has since developed into a method which is routinely used in practically every SEM laboratory.

The definitive step therefor was the introduction of energy-dispersive X-ray detectors (EDX detectors), which are distinguished by their simple and robust design, low maintenance, stable operation and not least the relatively large captured solid angle.

EDX detectors have an input window, a semiconductor crystal, which is arranged axially in the visual axis of the detector on a "cooling finger", and an amplifier unit, which typically comprises a field-effect transistor (FET) and a preamplifier. An EDX detector has a relatively large, homogeneous volume which can capture X-ray radiation from almost any direction. Particularly the large solid angle of the X-ray radiation captured by EDX detectors, i.e. the large amount of the radiation used from the total produced, allows microanalysis to be performed on ordinary, imaging electron microscopes.

The development of SEMs toward ever better electron-optical resolution, the improvement in electron detectors, but also the increased interest in organic or otherwise sensitive samples have resulted in the usual beam current being lowered to the extent that in many cases there are distinct limits set even with EDX detectors. It is currently possible to compensate for such limits only by virtue of extremely long measurement times.

The problem becomes particularly distinct in the case of "SDD detectors" (silicon drift detectors), the physical mode of action and design of which means that they would be able to capture a multiple of the usual volume of radiation. When the beam current is limited on account of the sample or the appliance, the only way of increasing the captured volume of radiation and hence reducing the measurement time is to increase the radiation solid angle captured by the detector. For this purpose, it is desirable for the distance between the detector and the sample to be as short as possible.

This is limited by the detector size and the design circumstances of the electron microscope, however. The best operating distance between pole shoe and sample for imaging production in the electron microscope is approximately 4 mm, with an increase in said operating distance impairing the image quality. In order to position the EDX detector as close to the sample as possible, the detector finger would optimally need to be positioned between pole shoe and sample in the electron microscope. There is therefore the need for the detector fingers of EDX detectors to be designed to be as small as possible so that the operating distance in the electron microscope does not need to be increased unnecessarily.

The sensor chip of the SDD detector must not be affected by this reduction, since otherwise the captured volume of radiation and hence the sensitivity of the SDD detector would likewise be reduced.

It is therefore the object of the present invention to minimize the detector size of an X-ray detector, particularly of an SDD detector, ideally while maintaining the sensor chip surface area.

SUMMARY OF THE INVENTION

The object is achieved on the basis of a first aspect of the invention by a sensor head having the features of claim 1.

Further inventive refinements are described by means of the features of the subclaims.

The invention relates to a sensor head for an X-ray detector, comprising a printed circuit board having an end face and lateral faces, a sensor chip which is arranged on the end face of the printed circuit board and which is sensitive to X-ray radiation, a plurality of signal and control connections, a plurality of bonding islands which are arranged on the printed circuit board so as to make contact and at least some of which are electrically conductively connected to the signal and control connections by means of at least one respective bonding wire, wherein the bonding islands are arranged on the lateral faces of the printed circuit board or the printed circuit board has cutouts on the lateral faces, wherein the signal and control connections end beneath the cutouts or extend into them and the bonding islands are arranged on the end face of the printed circuit board next to a respective cutout.

The inventive arrangement of the bonding islands on the lateral faces of the printed circuit board, together with lateral bonding of the bonding wires, allows the components of the sensor head to be arranged in a space-saving manner, which allows an overall reduction in the sensor head.

Alternatively, the signal and control connections are inserted into the cutouts in the printed circuit board. This arrangement of the components of the sensor head is also extremely space-saving and, overall, allows a distinct reduction in the sensor head.

In one preferred refinement of the invention, the end face of the printed circuit board has an octagonal contour, wherein the opposite lateral faces are of equal length and the adjacent lateral faces are of different length. In one particularly preferred embodiment, the printed circuit board has four mutually opposite long lateral faces and four mutually opposite short lateral faces which are arranged alternately. Particularly the octagonal contour of the end face dispenses with the unused corner areas of a usually square end face and allows better matching to the usually round sensor head.

In this case, the bonding islands are preferably arranged on the long lateral faces, and there are preferably between two and eight, particularly between three and six and most preferably three or four bonding islands per long lateral face. Altogether, the printed circuit board has at least six bonding islands which are preferably arranged regularly on the printed circuit board.

The individual bonding islands are separated by a distance which is chosen to be as short as possible, said distance not being permitted to be below a minimum distance. This minimum distance must be of exactly such magnitude that the bonding islands are not in electrical contact with one another. Preferably, the distance between the centers of the bonding islands is less than 2 mm. Particularly preferably, a distance of 1.5 mm and/or 1.4 mm is chosen between the centers of the bonding islands. In particular, the distance between the bonding islands corresponds to the distance between the signal and control connections.

In a further preferred embodiment, the printed circuit board has cutouts on the long lateral faces. In this embodiment, the bonding islands are arranged in the cutouts. The lateral extent of the cutouts corresponds to the lateral extent of the bonding islands. The distance between the centers of the bonding islands corresponds to the distance in the embodiment without cutouts.

The total length of the long lateral faces corresponds at least to the product of the maximum number of bonding islands arranged per side and the distance A of said bonding islands from one another. The total length of the short lateral faces is chosen such that an octagonal surface area is obtained when the long lateral faces are connected.

A suitable base material for the printed circuit board according to the invention is any of the materials known from the prior art. By way of example, paper impregnated with phenolic resin or epoxy resin, glass fiber of a fabric impregnated with epoxy resin, Teflon, polyester film or ceramic can be used. The conductor tracks consist of the conductive materials known to a person skilled in the art, preferably copper. In one particularly preferred embodiment, the printed circuit board according to the invention is a multilayer composite ceramic. The manufacture of appropriate composite ceramics is known to a person skilled in the art.

The material for the bonding islands according to the invention is chosen such that it produces an electrical connection between the printed circuit board and a bonding wire. In particular, the material is chosen such that the bonding island remains immovable and dimensionally stable during the bonding process. Appropriate materials, for example adhesives containing metals or metal powders, are known in the prior art. Preferably, the bonding islands according to the invention consist of gold and/or aluminum.

A suitable sensor chip is any of the X-ray-sensitive sensor chips known to a person skilled in the art. By way of example, the sensor chip may be an Si(Li) detector, an HPGe detector, a PIN diode, a detector comprising compound semiconductors, an SDD with external transistors or an integrated FET silicon drift detector (I-FET SDD). In particular, the sensor chip used according to the invention is a silicon drift detector. The sensor chip in the sensor head according to the invention has a square or octagonal surface area. Preferably, the surface area of the sensor chip is smaller than or the same size as the end face of the printed circuit board.

In order to stabilize thermal conditions and possibly to produce operating temperatures which are below room temperature, a further refinement of the invention allows a cooling element, particularly a thermoelectric cooler, to be arranged on that side of the printed circuit board which is remote from the end face.

The thermoelectric cooler preferably comprises a plurality of Peltier elements which are arranged in a holder. The holder is simultaneously the cold side and the hot side of the thermoelectric cooler, the cold side being the side which faces the printed circuit board. In a further embodiment, the cold side of the thermoelectric cooler is simultaneously the printed circuit board. The diagonal of the cold side is preferably larger than the diagonal of the hot side of the thermoelectric cooler.

In a further preferred embodiment, the signal and control connections used are contact pins. The contact pins according to the invention are electrically conductive materials in pin form, preferably gilded. For the purposes of insulation and avoiding unwanted electric conduction, the contact pins are preferably enclosed in a tubular glass body which is open at both ends and hence reveals the contact pin for the purpose of making contact.

In line with a first embodiment of the invention, the contact pins are arranged on that side of the printed circuit board which is remote from the end face such that the longitudinal axes of the contact pins are plumb on the lateral faces of the printed circuit board. On the side of the contact pins which faces the printed circuit board, the contact pins are electrically conductively connected to the printed circuit board at the bonding islands on the lateral faces of the printed circuit board by means of at least one respective bonding wire. In this case, the bonding wire is preferably situated in one plane with the lateral faces of the printed circuit board and the longitudinal axis of the contact pins.

Alternatively, the contact pins are arranged such that the longitudinal axes of the contact pins are plumb on the center of the cutouts. In this case, the contact pins can end beneath the cutouts or extend into them. Preferably, the contact pins end in the plane of the end face of the printed circuit board. The bonding islands are then arranged directly next to the cutouts on the end face of the printed circuit board. In this solution according to the invention, the bonding is effected from above.

In line with the invention, at least some of the contact pins which are present are connected to the bonding islands of the printed circuit board. The number of bonded contact pins is obtained from the number of signal and control connections required. In particular, at least six of the contact pins are connected as signal and control connections to the printed circuit board. Two further contact pins are preferably soldered to the thermoelectric cooler.

In a further refinement, that side of the printed circuit board which is remote from the end face is arranged on a plinth. The plinth is used for mechanically attaching the components of the sensor head. Preferably, the plinth consists of a material with good thermal conductivity. Suitable materials are known to a person skilled in the art; in particular, copper is used for manufacturing the plinth.

In one preferred embodiment, that side of a baseplate which is remote from the end face is also arranged on the plinth. Said baseplate has holes which contain the glass bodies which contain the contact pins. Preferably, the length of the glass bodies corresponds to the thickness of the baseplate.

In one preferred embodiment, the baseplate is in the form of a ring, wherein the plinth is guided through the central opening in the baseplate. The baseplate may be produced from any materials known to a person skilled in the art which have sufficient strength and in which it is possible to insert the holes. In particular, the baseplate is produced from stainless steel.

The inventive arrangement of the bonding islands, the bonding wires and the contact pins achieves advantageous, partly unforeseen effects. First and foremost, in comparison with the bonding used in the prior art, the bonding wire is successfully guided in a shorter and hence direct connection between the contact pin and the bonding island by means of loops. This is a significant improvement to the prior art.

Furthermore, the bonding wires are no longer brought into contact with the bonding islands from above, as is customary in the prior art, but rather are brought into contact therewith from the side. This likewise results in the bonding wire being shortened and in the space-taking loop formation being avoided.

The bonding arrangement according to the invention allows the further advantageous arrangement of the remaining components of the sensor head in accordance with the invention. In particular, the invention involves the contact pins not being arranged next to the printed circuit board, as is customary, but rather beneath it, i.e. on that side of the printed circuit board which is remote from the end face, which results in a significant reduction in the physical extent of the sensor head.

The sensor head according to the invention has a diameter which is less than 14 mm, particularly less than 13 mm, preferably less than 12 mm and even more preferably less than 11 mm, with an active surface area of the sensor chip being 10 mm$^2$. In this way, the arrangement according to the invention is used to achieve a reduction in the physical extent by up to above 25% in comparison with the diameters of sensor heads which are known in the prior art while simultaneously maintaining the active surface area of the sensor chip.

A second aspect of the invention relates to an X-ray detector, particular an EDX X-ray detector, which contains the sensor head according to the invention.

The invention is explained in more detail below with reference to exemplary embodiments and the associated drawings, in which:

DETAILED DESCRIPTION OF THE PRESENTLY PREFERRED EMBODIMENTS

Figure 1:
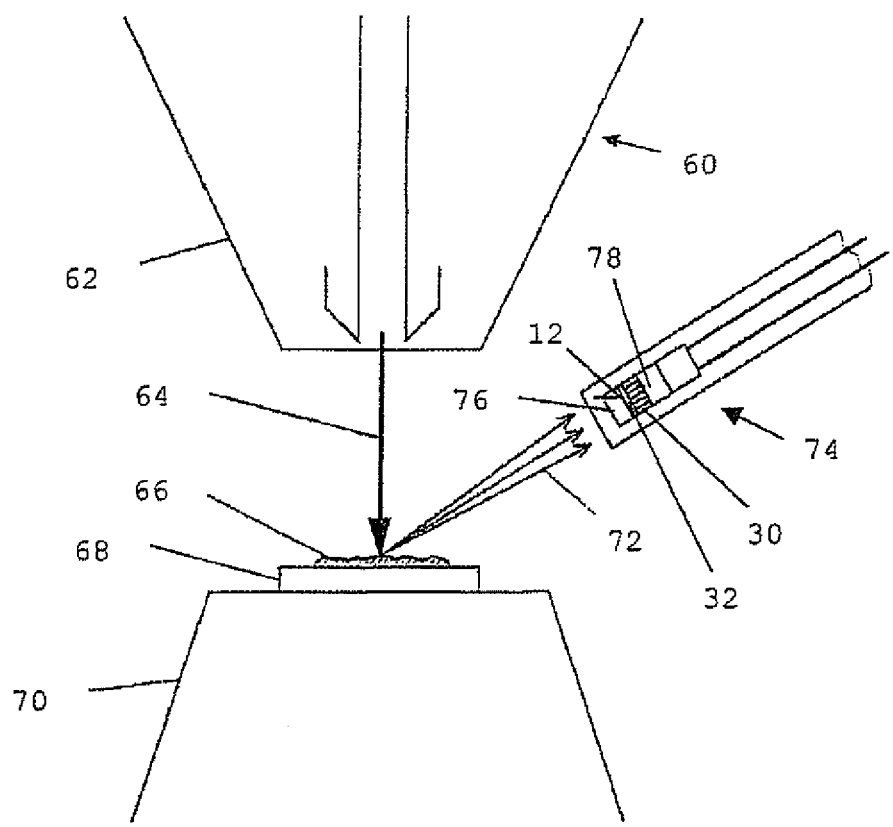
FIG. 1 shows a basic design for electron beam microanalysis with an SEM and an X-ray detector 74.

FIG. 1 shows an apparatus for electron beam microanalysis in which an SEM, denoted overall by 60, has a pole shoe 62 from which an electron beam 64 emerges. The electron beam 64 is directed at a sample 66 which is held by a sample holder 68 which is situated on a sample table 70. The electron beam 64 emerging from the pole shoe 62 of the electron microscope 60 excites the sample 66 held in the sample holder 68, as a result of which X-ray radiation 72 is emitted by the sample 66 and is subsequently detected in an X-ray detector 74.

The EDX X-ray detector 74, of which only the "cooling finger" is shown here, has a sensor head 30 with a semiconductor crystal as sensor chip 32. An X-ray-sensitive end face 12 of the sensor chip 32 is irradiated by the entering X-ray radiation 72. At the rear of the sensor head 30, the X-ray detector 74 has a cooling apparatus 78, which is particularly a thermoelectric cooler. On that side of the sensor chip 32 which faces the X-ray radiation 72, there is also a magnet trap 76, the task of which is to deflect stray electrons from the electron beam 64 in order to protect the sensor chip 32 from them.

Figure 2A:
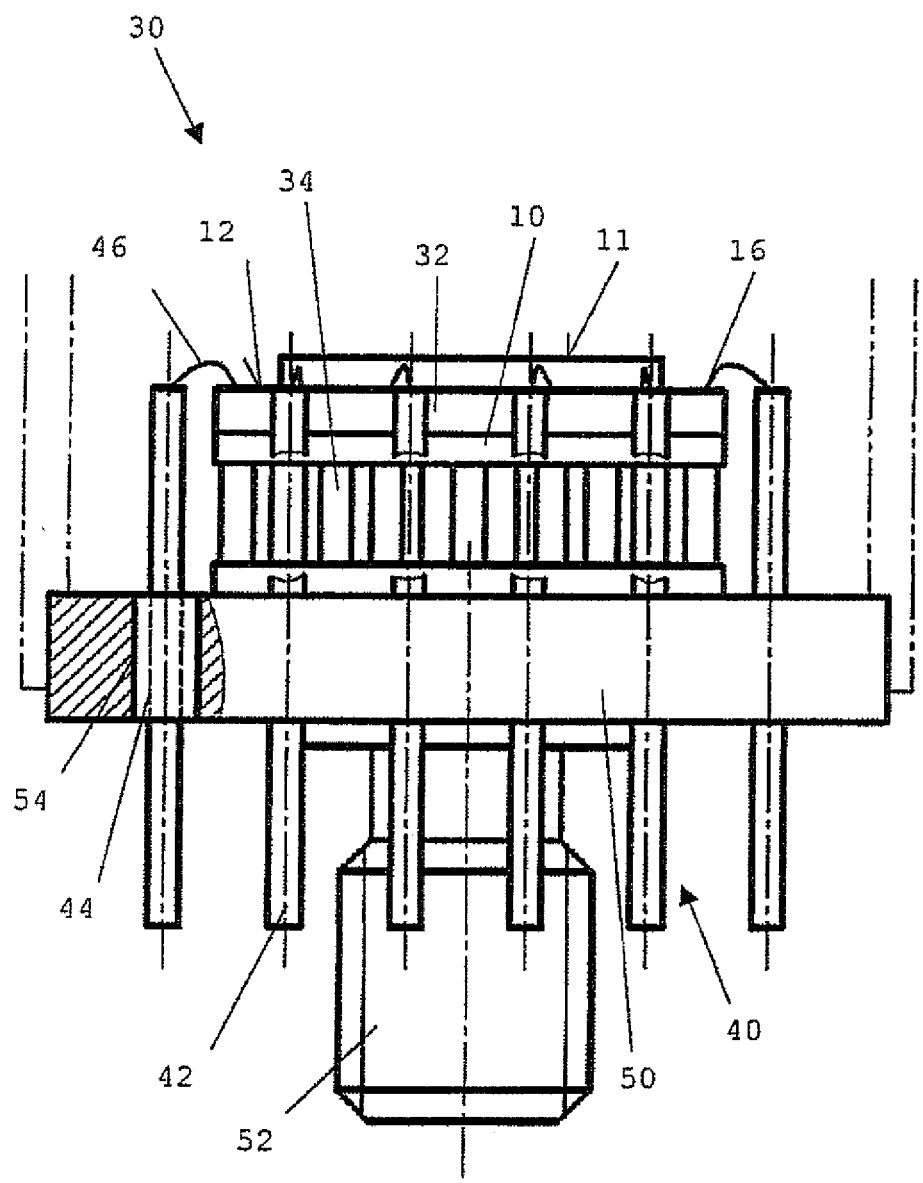
FIGS. 2a, 2b show a side view of a sensor head 30 according to the invention (FIG. 2b) in comparison with a sensor head from the prior art (FIG. 2a)

FIG. 2a shows a side view of a sensor head 30 for an X-ray detector 74 according to the prior art. A sensor chip 32, having a surface area 11 which is smaller than an end face 12 of a printed circuit board 10, is mounted centrally on the end face 12 of the printed circuit board 10. The free marginal areas of the end face 12 contain bonding islands 16. A side which is remote from the end face 12 has a thermoelectric cooler 34 arranged on it. The sensor chip 32, the printed circuit board 10 and the thermoelectric cooler 34 are mounted for the purpose of mechanical attachment on a plinth 52 which forms the center of an annular baseplate 50. The diameter of the baseplate 50 is greater than the diagonal of the end face 12 of the printed circuit board 10. The marginal areas of the baseplate 50 contain holes 54 which are arranged in the baseplate 50 such that they are not covered by the end face 12 of the printed circuit board 10. The holes 54 hold tubular glass bodies 44 having contact pins 42 situated therein. The contact pins 42 are signal and control connections 40 which are needed for the operation of the sensor chip 32. The length of the glass bodies 44 corresponds to the thickness of the baseplate. On that side which faces the sensor chip 32, the contact pins 42 terminate flush with the end face 12 of the printed circuit board 10. From the ends of the contact pins 42, bonding wires 46 are routed in the form of a loop to the bonding islands 16 on the printed circuit board 10.

Figure 2B:
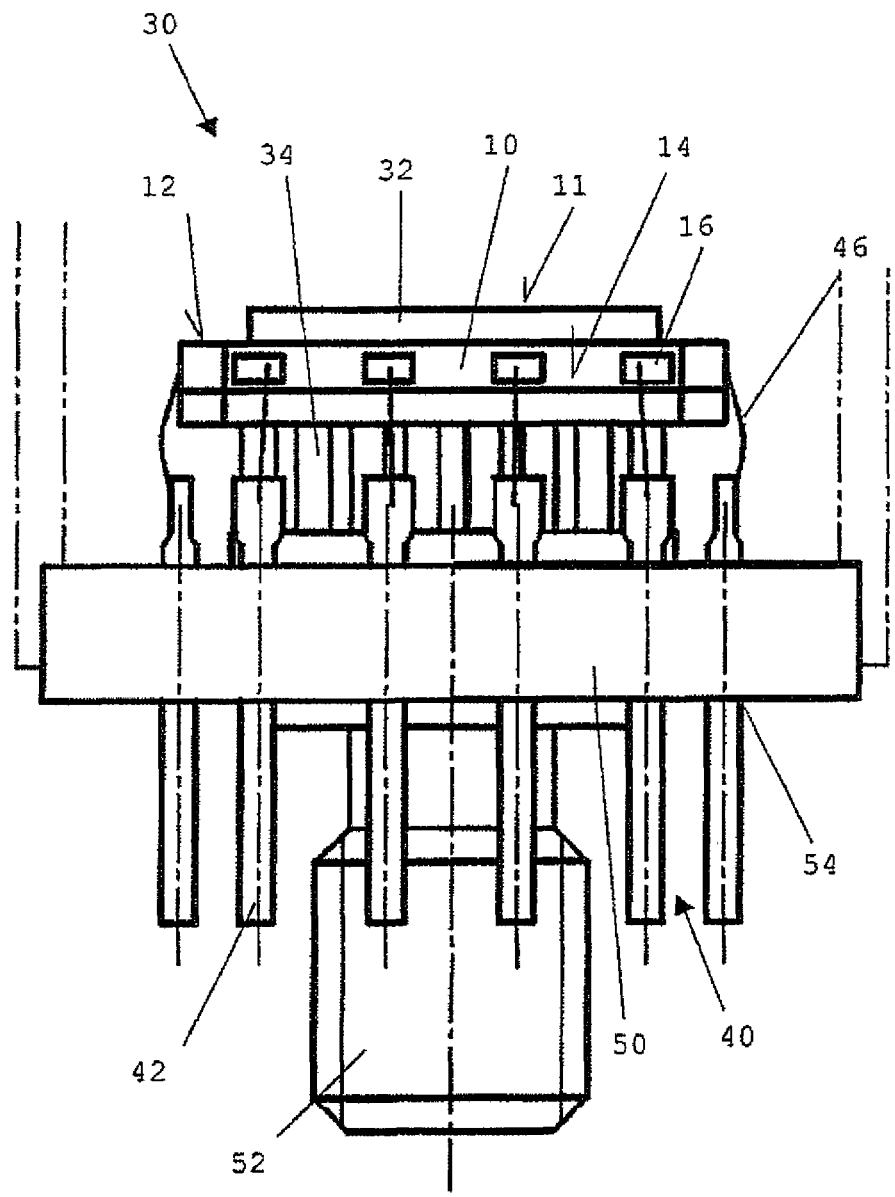

FIG. 2b shows a side view of the sensor head 30 according to the invention for the X-ray detector 74. The sensor chip 32 is mounted on the end face 12 of the printed circuit board 10. In contrast to the prior art, the bonding islands 16 are located on the lateral faces 14 of the printed circuit board 10. That side which is remote from the end face 12 has the thermoelectric cooler 34 arranged on it. The sensor chip 32, the printed circuit board 10 and the thermoelectric cooler 34 are mounted for the purpose of mechanical attachment on the plinth 52, which forms the center of the annular baseplate 50. The baseplate 50 has the holes 54, which hold the tubular glass bodies 44 with the contact pins 42 situated therein. The contact pins 42 are the signal and control connections 40 which are needed for the operation of the sensor chip 32. In this case, the holes 54 are arranged in the baseplate 50 such that the longitudinal axis of the contact pins 42 is plumb on the lateral faces 14 of the printed circuit board 10. In comparison with the prior art, the contact pins 42 are shortened on that side which faces the printed circuit board 10 and protrude only a short distance from the baseplate 50. From the ends of the contact pins 42, the bonding wires 46 are routed as an extension of the longitudinal axis of the contact pins 42 as far as the bonding islands 16 on the lateral faces 14 of the printed circuit board 10. The bonding wires 46 are contact-connected in electrically conductive fashion at the side of the bonding islands 16.

Figure 3A:
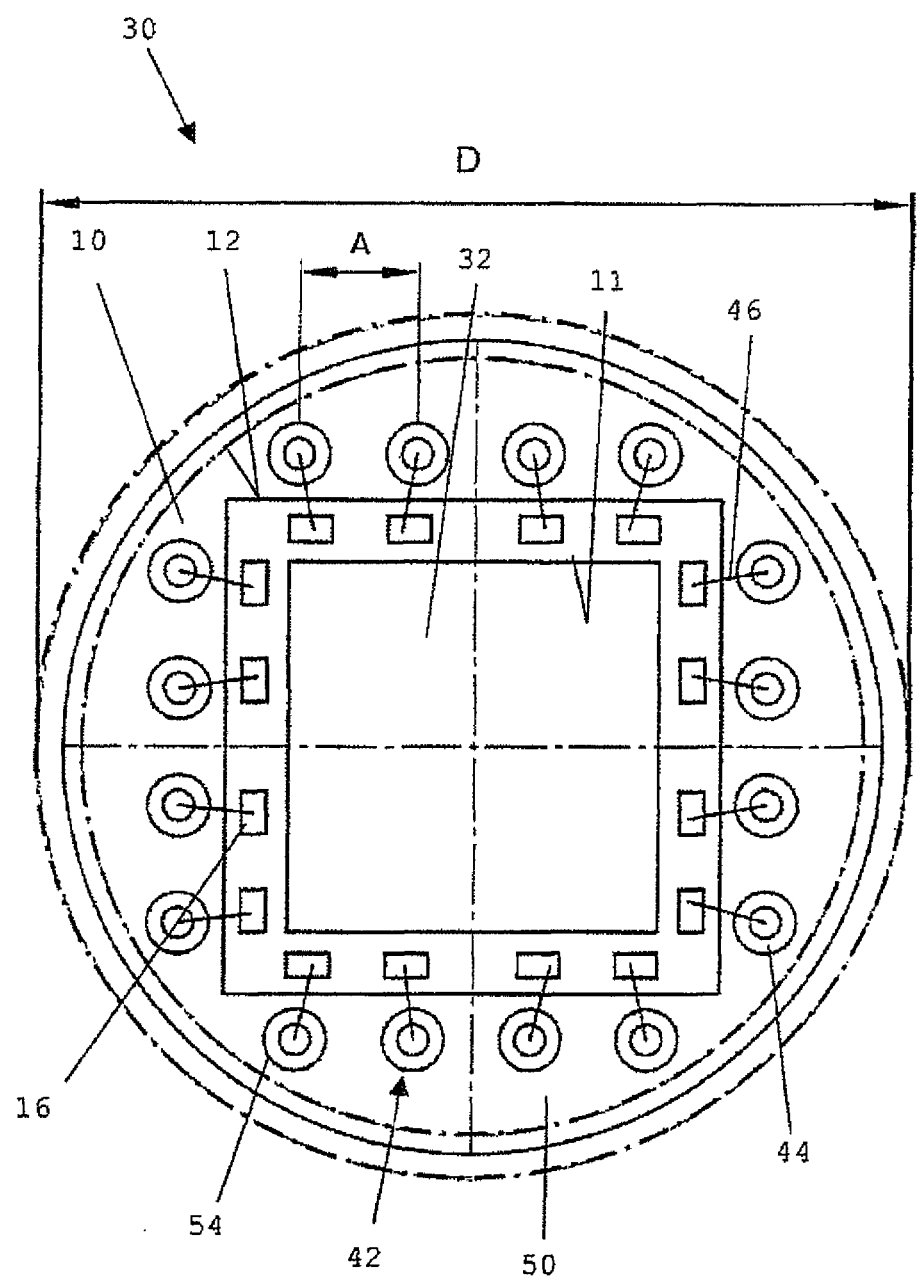
FIGS. 3a-g show a plan view of inventive refinements of the sensor head 30 according to the invention in comparison with a sensor head from the prior art.

FIG. 3a shows a plan view of the sensor head 30 for the X-ray detector 74 according to the prior art. The components of the sensor head 30 are described from top to bottom. The sensor chip 32 and the underlying printed circuit board 10 have a square base, the end face 12 of the printed circuit board 10 being larger than the surface area 11 of the sensor chip 32. On the end face 12 of the printed circuit board 10, four respective bonding islands 16 are located along the lateral faces of the sensor chip 32. The bonding islands 16 are arranged at regular distances from one another. The distance A between the centers of two bonding islands 16 is typically 1.9 mm. The contact pins 42 are arranged with the glass bodies 44 in the holes 54 in the baseplate 50, the diameter of the baseplate 50 being greater than the diagonal of the end face 12 of the printed circuit board 10, so that the contact pins 42 are arranged outside the end face 12 of the printed circuit board 10. There are usually at least eight, preferably between eight and sixteen contact pins 42 arranged in the baseplate 50. From the ends of the contact pins 42, the bonding wires 46 are routed in the form of a loop to the bonding islands 16 on the end face 12 of the printed circuit board 10. A diameter D of the sensor head 30 according to the prior art is typically 14 mm for an active surface area of the sensor chip of 10 mm².

Figure 3B:
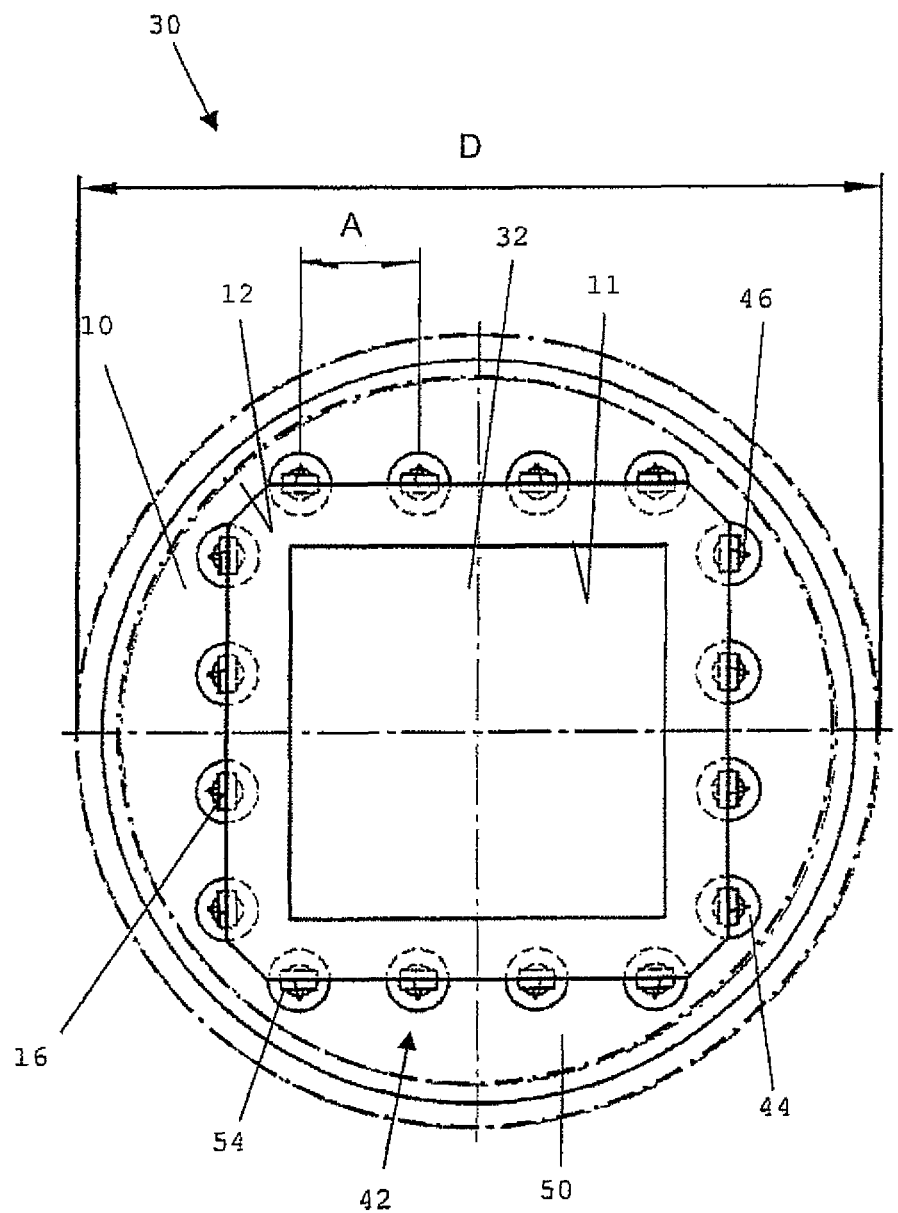

FIG. 3b shows a plan view of the sensor head 30 according to the invention for the X-ray detector 74. The components of the sensor head 30 are described from top to bottom. The sensor chip 32 has the square surface area 11. The adjoining printed circuit board 10 has the octagonal end face 12. From short lateral faces 20 and long lateral faces 18, two respective lateral faces are opposite one another. The opposite lateral faces are of the same length. In contrast to the prior art, the bonding islands 16 are located on the long lateral faces 18 of the printed circuit board 10. Four respective bonding islands 16 per long lateral face 18 are arranged at regular distances from one another. The distance A between the centers of two bonding islands 16 is 1.9 mm. The contact pins 42 with the glass bodies 44 are arranged in the holes 54 in the baseplate 50, the diameter of which is greater than the diagonal of the end face 12 of the printed circuit board 10. There are usually at least eight, preferably between eight and sixteen, contact pins 42 arranged in the baseplate 50 in the holes 54. The longitudinal axes of the contact pins 42 are plumb on the long lateral faces 18. The areas of the contact pins 42 and of the glass bodies 44, which are situated beneath the printed circuit board 10 and therefore not visible to the observer in plan view, are shown as silhouettes to assist understanding. The diameter D of the sensor head 30 is 12.8 mm.

FIGS. 3c-3g show further refinements of the sensor head 30 according to the present invention, which allow increasing miniaturization.

Figure 3C:
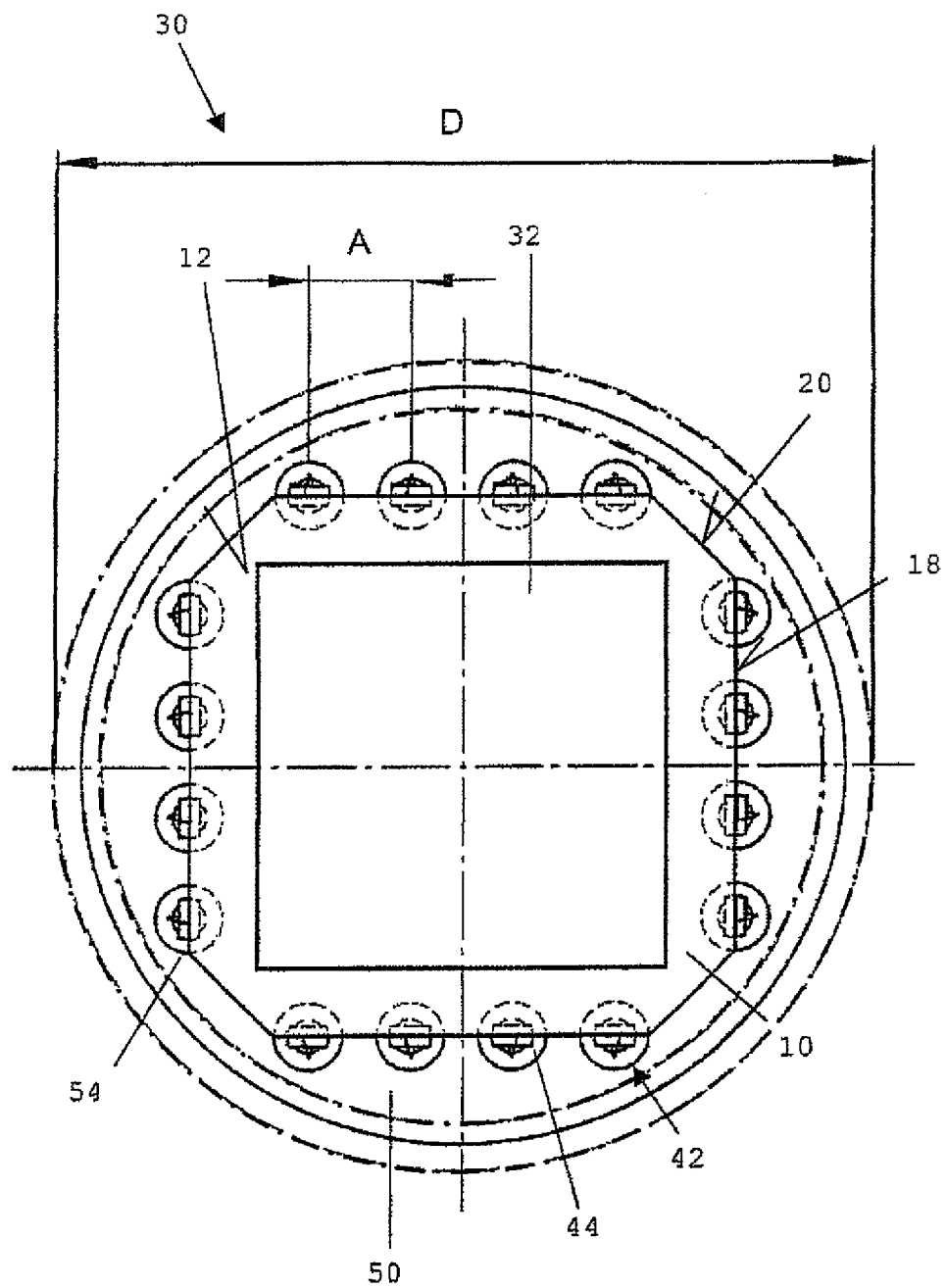
Figure 3D:
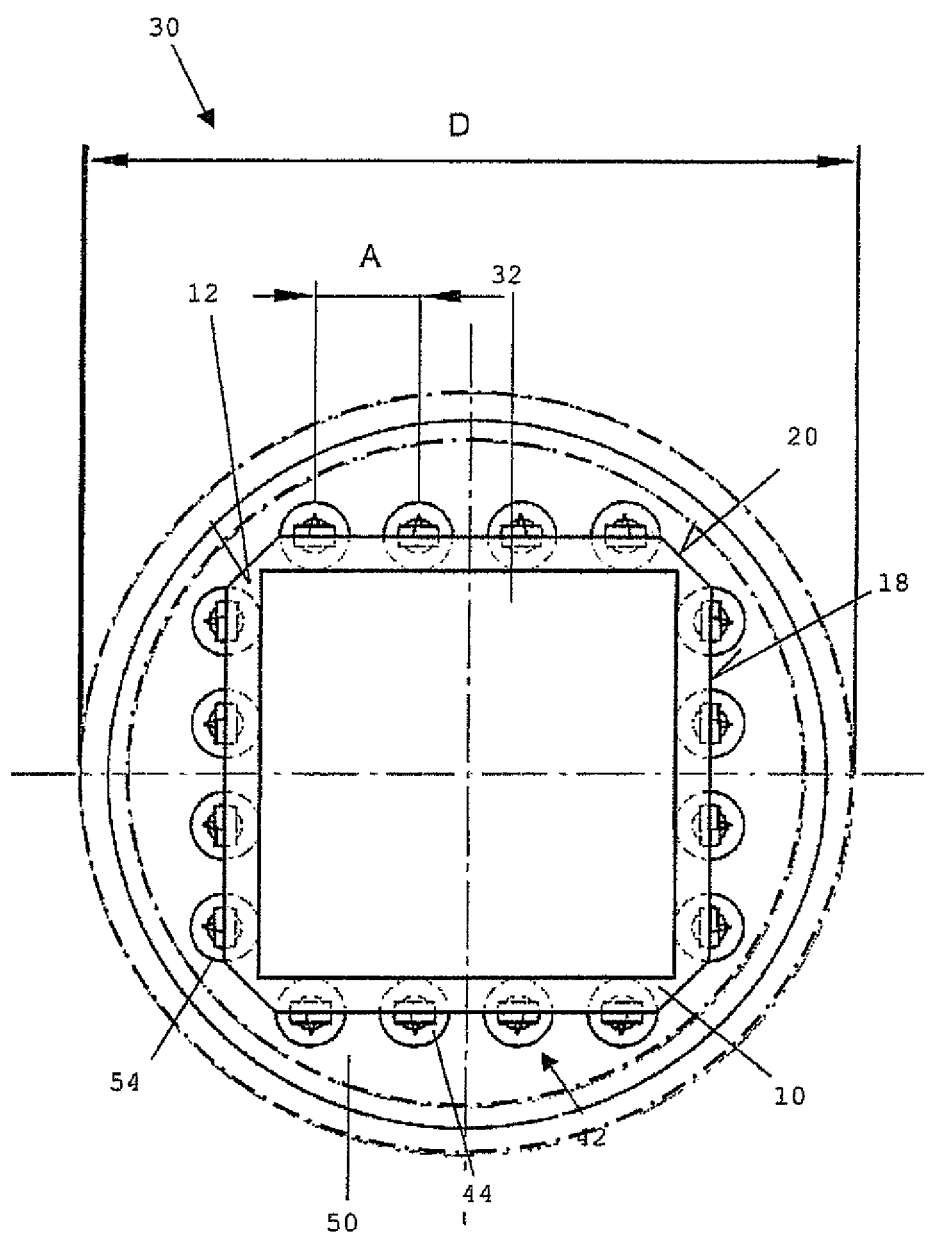

FIG. 3c shows a plan view of a further advantageous refinement of the sensor head 30 according to the invention for the X-ray detector 74. The design of the sensor head 30 corresponds to the design explained in FIG. 3b. The reference symbols are used analogously. Therefore, only the differences are described below. The short lateral faces 20 are extended in comparison with the embodiment shown in FIG. 3b, which means that the end face 12 of the printed circuit board 10 has been reduced as a result. The distance A between the centers of two bonding islands 16 is 1.5 mm. The diameter D of the sensor head 30 is 12 mm. FIG. 3d is like FIG. 3c. The end face 12 of the printed circuit board 10 has been reduced further. The diameter D of the sensor head 30 is 11.2 mm.

Figure 3E:
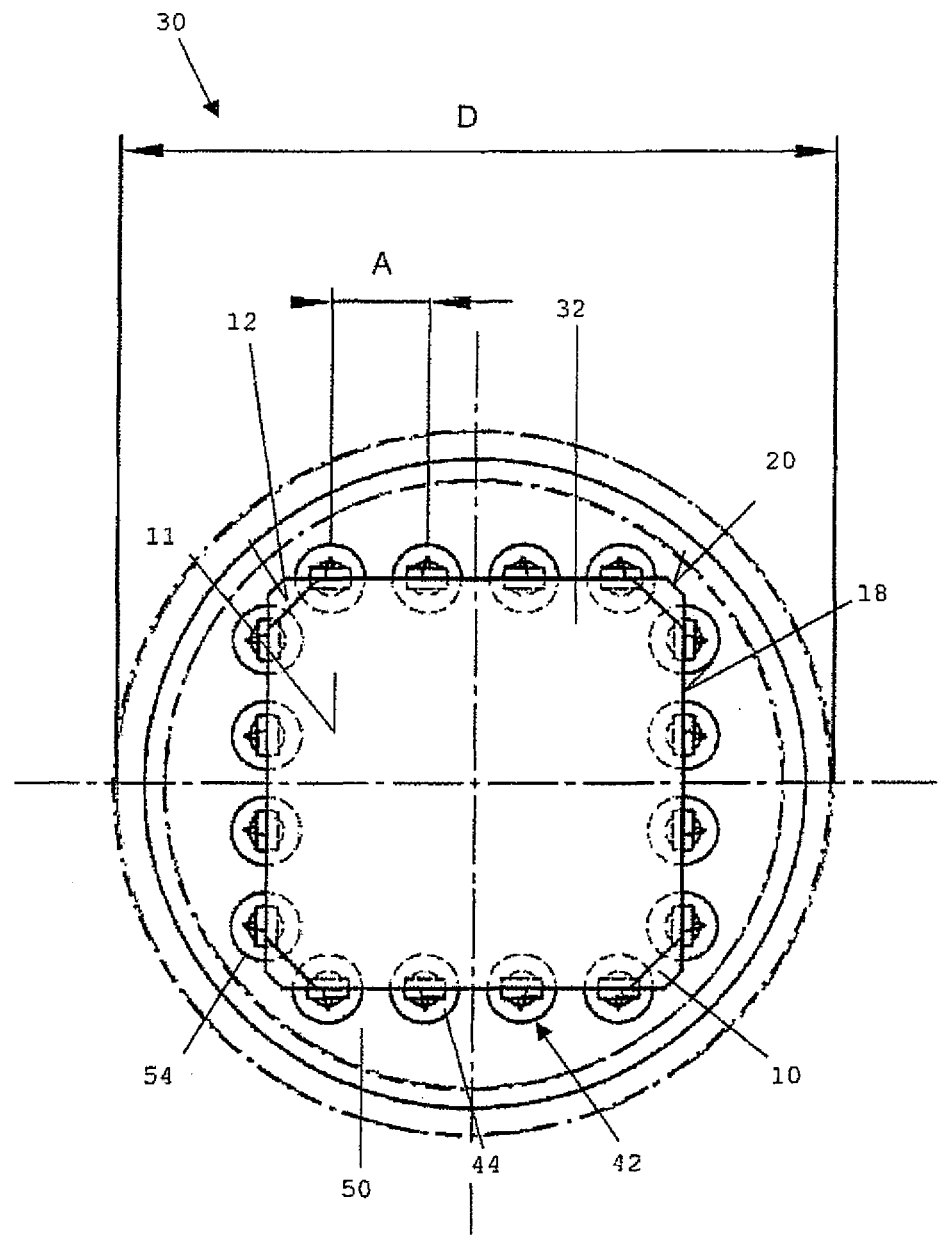

FIG. 3e is like FIG. 3d. The surface area 11 of the sensor chip 32 is in the form of an octagon, just like the end face 12 of the printed circuit board 10. The long lateral faces of the sensor chip 30 are plumb on the long lateral faces 18 of the printed circuit board 10 and are in shorter form. The short lateral faces of the sensor chip are longer than the short lateral faces 20 of the printed circuit board 10. The distance A between the centers of two bonding islands 16 is 1.4 mm. The diameter D of the sensor head 30 is 10.3 mm.

Figure 3F:
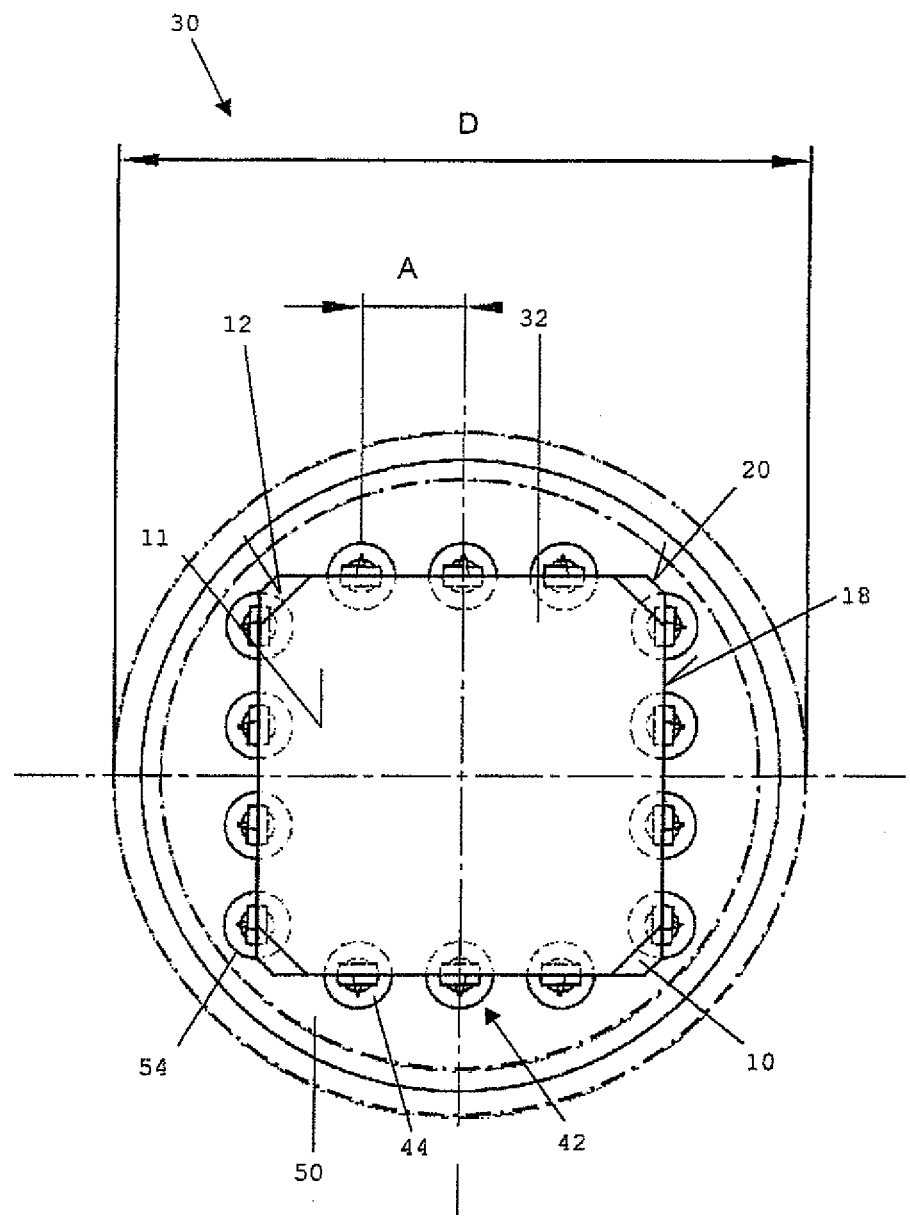

FIG. 3f is like FIG. 3e. Two opposite long lateral faces 18 of the printed circuit board 10 have three bonding islands 16 arranged on them at regular intervals, and the other two lateral faces 18 have four bonding islands 16. The distance A between the centers of two bonding islands 16 is 1.5 mm.

Figure 3G:
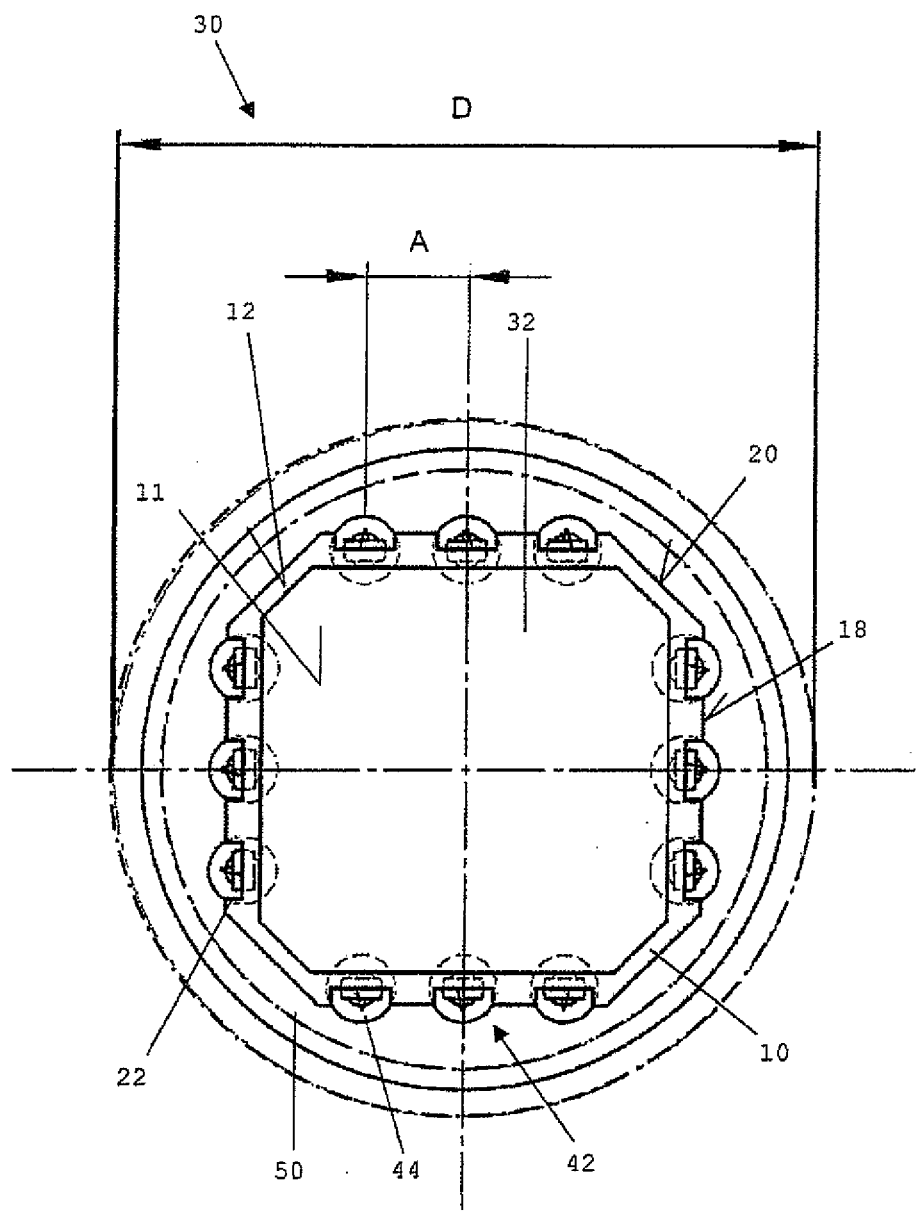

FIG. 3g is like FIG. 3f. The long lateral faces 18 of the printed circuit board 10 each have three cutouts 22. The cutouts 22 contain the bonding islands 16. Hence, each long lateral face 18 of the printed circuit board 10 has three bonding islands 16 arranged on it. The end face 12 of the printed circuit board 10 is larger than the surface area 11 of the sensor chip 32 by exactly the same amount as the sensor chip 32 does not protrude beyond the cutouts 22.

Figure 3H:
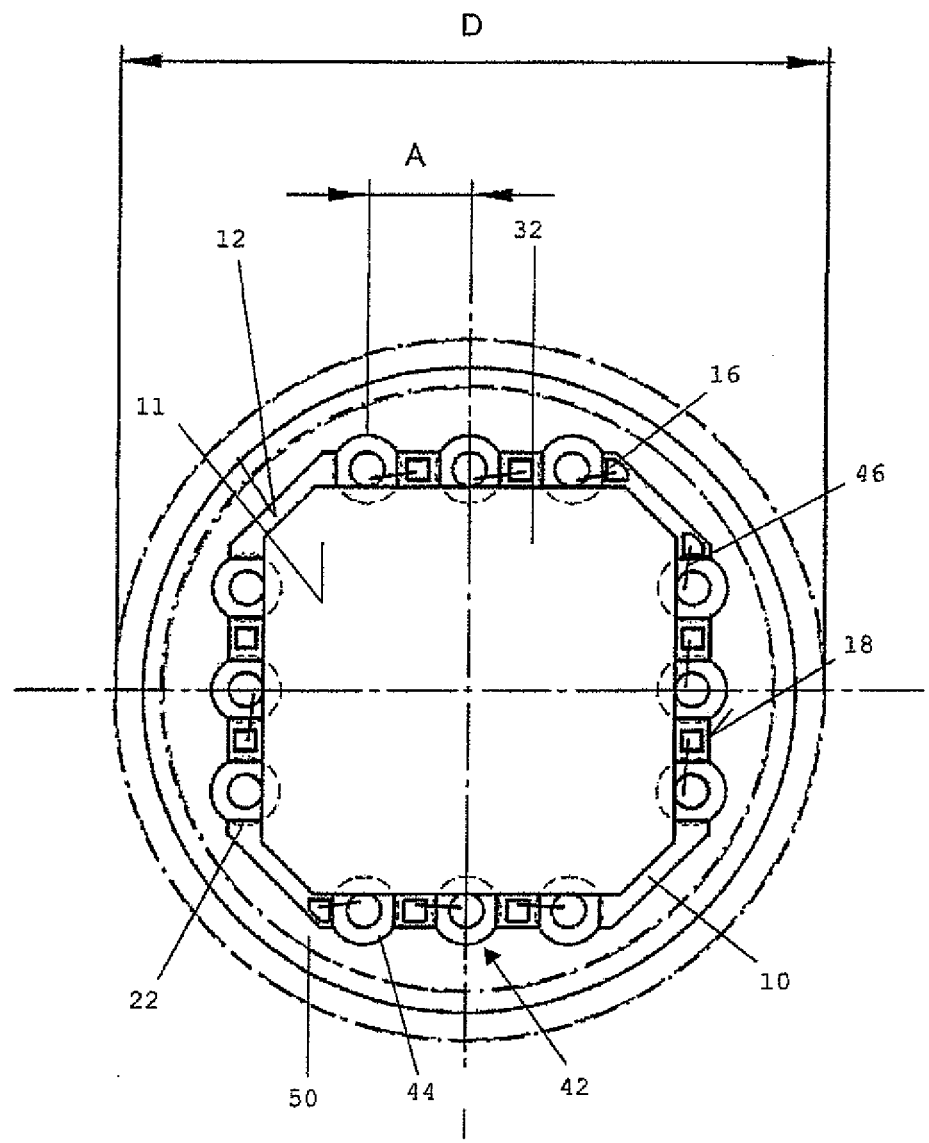
FIG. 3h shows a plan view of an alternative inventive refinement of the sensor head 30 according to the invention.

FIG. 3h shows an alternative solution to the object according to the invention. The long lateral faces 18 of the printed circuit board 10 each have three cutouts 22. The contact pins 42 are arranged such that the longitudinal axes of the contact pins 42 are situated plumb on the center of the cutouts 22. In this case, the contact pins 42 are arranged beneath the printed circuit board 10, but the ends are accessible from above. The contact pins 42 preferably end in the plane of the end face 12 of the printed circuit board 10. According to the invention, the bonding islands 16 are arranged directly next to the cutouts 22 on the end face 12 of the printed circuit board 10. In the case of this solution according to the invention, the bonding is effected from above.

LIST OF REFERENCE SYMBOLS

10 Printed circuit board
11 Surface area
12 End face
14 Lateral face
16 Bonding island
18 Long lateral face
20 Short lateral face
22 Cutout
30 Sensor head
32 Sensor chip
34 Thermoelectric cooler
40 Signal and control connection
42 Contact pin
44 Glass body
46 Bonding wire
50 Baseplate
52 Plinth
54 Hole
60 SEM
62 Pole shoe
64 Electron beam
66 Sample
68 Sample holder
70 Sample table
72 X-ray radiation
74 X-ray detector
76 Magnet trap
78 Cooling apparatus
D Diameter
A Distance

The invention claimed is:

1. A sensor head for an X-ray detector, comprising
   a printed circuit board having an end face and lateral faces,
   a sensor chip which is arranged on the end face of the printed circuit board and which is sensitive to X-ray radiation,
   a plurality of signal and control connections which are arranged on the side the printed circuit board facing away from the end face of said printed circuit board,
   a plurality of bonding islands which are arranged on the printed circuit board so as to make contact and at least some of which are electrically conductively connected to the signal and control connections by means of at least one respective bonding wire,
   characterized by one of the following measures:
   (a) the bonding islands are arranged on the lateral faces of the printed circuit board and
   (b) the printed circuit board has cutouts on the lateral faces, wherein the bonding islands are arranged on the end face of the printed circuit board, next to a respective cutout, and the signal and control connections (b1) end beneath the cutouts or (b2) extend into the cutouts.

2. The sensor head as claimed in claim 1, wherein the end face of the printed circuit board has an octagonal contour, particularly having four mutually opposite long lateral faces and four mutually opposite short lateral faces.

3. The sensor head as claimed in claim 2, wherein the bonding islands are arranged on the long lateral faces of the octagonal base of the printed circuit board.

4. The sensor head as claimed in claim 2, wherein the number of bonding islands per long lateral face is between two and eight, particularly between three and six, preferably three or four.

5. The sensor head as claimed in one of claims 1, wherein in measure (a) the printed circuit board has cutouts on the lateral faces and the bonding islands are arranged in the cutouts.

6. The sensor head as claimed in claim 1, wherein the bonding islands are of aluminum or gold.

7. The sensor head as claimed in claim 1, wherein the printed circuit board is a multilayer composite ceramic.

8. The sensor head as claimed in claim 1, wherein a diameter (D) of the sensor head is less than 14 mm and an active surface area of the sensor chip is 10 mm$^2$.

9. The sensor head as claimed in claim 1, wherein a side of the printed circuit board which is remote from the end face has a cooling element, particularly a thermoelectric cooler, arranged on it.

10. The sensor head as claimed in claim 1, wherein the sensor chip has a square or octagonal surface area which, in particular, is smaller than or the same size as the end face of the printed circuit board.

11. The sensor head as claimed in claim 1, wherein the signal and control connections are contact pins which, in particular, have a glass body.

12. The sensor head as claimed in claim 11, wherein the contact pins are arranged on that side of the printed circuit board which is remote from the end face, wherein the contact pins are completely or partly concealed by the end face of the printed circuit board.

13. The sensor head as claimed in claim 1, wherein that side of the printed circuit board which is remote from the end face is arranged on a plinth.

14. The sensor head as claimed in claim 13, wherein that side of a baseplate which is remote from the end face is arranged on the plinth, wherein the baseplate has holes which contain the glass bodies comprising the contact pins.

15. An X-ray detector, particularly an EDX X-ray detector, having a sensor head as claimed in claim 1.

* * * * *